(12) United States Patent
Woods et al.

(10) Patent No.: US 8,359,871 B2
(45) Date of Patent: Jan. 29, 2013

(54) TEMPERATURE CONTROL DEVICE

(75) Inventors: Mark C. Woods, Richardson, TX (US); Leonard J. Recine, Plano, TX (US); James L. Bierschenk, Rowlett, TX (US); Overton L. Parish, Frisco, TX (US)

(73) Assignee: Marlow Industries, Inc., Dallas, TX (US)

( * ) Notice: Subject to any disclaimer, the term of this patent is extended or adjusted under 35 U.S.C. 154(b) by 417 days.

(21) Appl. No.: 12/658,541

(22) Filed: Feb. 10, 2010

(65) Prior Publication Data

US 2010/0199687 A1 Aug. 12, 2010

Related U.S. Application Data

(60) Provisional application No. 61/151,743, filed on Feb. 11, 2009.

(51) Int. Cl.
F25B 21/02 (2006.01)

(52) U.S. Cl. .................. 62/3.2; 62/3.3; 62/3.7

(58) Field of Classification Search ........ 62/3.2, 62/3.3, 3.7; 165/181, 182, 80.3; 136/203, 136/204

See application file for complete search history.

(56) References Cited

U.S. PATENT DOCUMENTS

| | | | |
|---|---|---|---|
| 2,949,014 A | 8/1960 | Belton, Jr. et al. ............... 62/3 |
| 3,040,538 A | 6/1962 | Alsing .............................. 62/3 |
| 3,178,895 A | 4/1965 | Mole et al. ...................... 62/3 |
| 3,213,630 A | 10/1965 | Mole ................................ 62/3 |
| 4,065,936 A * | 1/1978 | Fenton et al. ................. 62/3.3 |
| 4,777,802 A | 10/1988 | Feher ............................... 62/3 |
| 5,002,336 A | 3/1991 | Feher ........................... 297/180 |
| 5,117,638 A | 6/1992 | Feher ........................... 62/3.2 |
| 5,409,547 A * | 4/1995 | Watanabe et al. ........... 136/204 |
| 5,561,981 A | 10/1996 | Quisenberry et al. ........ 62/3.7 |
| 5,584,183 A | 12/1996 | Wright et al. ................. 62/3.7 |
| 5,597,200 A | 1/1997 | Gregory et al. ......... 297/180.13 |
| 5,626,021 A | 5/1997 | Karunasiri et al. ............ 62/3.5 |
| 5,737,923 A * | 4/1998 | Gilley et al. ................... 62/3.7 |
| 5,924,766 A | 7/1999 | Esaki et al. ............ 297/180.13 |
| 6,079,485 A | 6/2000 | Esaki et al. .................... 165/43 |
| 6,119,463 A | 9/2000 | Bell ................................ 62/3.7 |
| 6,223,539 B1 | 5/2001 | Bell ................................ 62/3.7 |
| 6,510,696 B2 | 1/2003 | Guttman et al. .............. 62/3.3 |
| 6,530,231 B1 | 3/2003 | Nagy et al. .................... 62/3.2 |
| 6,539,725 B2 | 4/2003 | Bell ................................ 62/3.7 |
| 6,571,862 B1 * | 6/2003 | Wang et al. ................. 165/80.3 |
| 6,580,025 B2 * | 6/2003 | Guy .............................. 136/201 |
| 6,598,405 B2 | 7/2003 | Bell ................................ 62/3.3 |
| 6,606,866 B2 | 8/2003 | Bell ................................ 62/3.7 |
| 6,619,044 B2 * | 9/2003 | Batchelor et al. ............. 62/3.3 |
| 6,625,990 B2 | 9/2003 | Bell ................................ 62/3.3 |
| 6,637,210 B2 | 10/2003 | Bell ................................ 62/3.7 |
| 6,662,571 B1 * | 12/2003 | Nagy et al. .................... 62/3.2 |
| 6,672,076 B2 | 1/2004 | Bell ................................ 62/3.3 |
| 6,700,052 B2 | 3/2004 | Bell .............................. 136/201 |
| 6,705,089 B2 * | 3/2004 | Chu et al. ....................... 62/3.2 |
| 6,755,026 B2 * | 6/2004 | Wallach ........................ 62/3.7 |
| 6,782,195 B2 * | 8/2004 | Abras et al. ................. 392/480 |

(Continued)

*Primary Examiner* — Mohammad Ali
(74) *Attorney, Agent, or Firm* — Baker Botts L.L.P.

(57) ABSTRACT

A temperature control device includes a thermoelectric device and a first sink. The thermoelectric device includes a plurality of thermoelectric elements electrically interconnected with one another by a plurality of electrical interconnects which are coupled between an interior surface of a first plate and an interior surface of a second plate. The first sink has a flat bottom and a plurality of generally parallel fins extending out of the flat bottom. Also, the flat bottom is coupled to an exterior surface of the first plate by a coupling media that includes a resilient and thermally-conductive pad.

20 Claims, 5 Drawing Sheets

FIG. 4

U.S. PATENT DOCUMENTS

| | | | |
|---|---|---|---|
| 6,807,811 B2 * | 10/2004 | Lee | 62/3.7 |
| 6,812,395 B2 | 11/2004 | Bell | 136/201 |
| 6,815,814 B2 * | 11/2004 | Chu et al. | 257/722 |
| 6,823,678 B1 * | 11/2004 | Li | 62/3.5 |
| 6,855,880 B2 | 2/2005 | Feher | 136/203 |
| 6,907,739 B2 | 6/2005 | Bell | 62/3.7 |
| 6,948,321 B2 | 9/2005 | Bell | 62/3.2 |
| 6,959,555 B2 | 11/2005 | Bell | 62/3.7 |
| 7,032,389 B2 * | 4/2006 | Cauchy | 62/3.3 |
| 7,111,465 B2 | 9/2006 | Bell | 62/3.7 |
| 7,114,771 B2 | 10/2006 | Lofy et al. | 297/180.13 |
| 7,178,344 B2 | 2/2007 | Bell | 62/3.7 |
| 7,231,772 B2 | 6/2007 | Bell | 62/3.7 |
| 7,273,981 B2 | 9/2007 | Bell | 136/205 |
| 7,278,270 B2 * | 10/2007 | Culp et al. | 62/3.6 |
| 7,305,839 B2 * | 12/2007 | Weaver, Jr. | 62/132 |
| 7,331,183 B2 * | 2/2008 | Askew | 62/3.2 |
| 7,380,586 B2 | 6/2008 | Gawthrop | 165/202 |
| 7,421,845 B2 | 9/2008 | Bell | 62/3.2 |
| 7,426,835 B2 | 9/2008 | Bell et al. | 62/3.3 |
| 7,475,464 B2 | 1/2009 | Lofy et al. | 29/91.1 |
| 7,475,551 B2 * | 1/2009 | Ghoshal | 62/3.2 |
| 7,587,901 B2 | 9/2009 | Petrovski | 62/3.3 |
| 7,587,902 B2 | 9/2009 | Bell | 62/3.7 |
| 7,591,507 B2 | 9/2009 | Giffin et al. | 297/180.1 |
| 7,608,777 B2 | 10/2009 | Bell et al. | 136/200 |
| 7,640,754 B2 | 1/2010 | Wolas | 62/3.61 |
| 7,665,803 B2 | 2/2010 | Wolas | 297/180.13 |
| 7,866,164 B2 * | 1/2011 | Rice | 62/3.3 |
| 8,039,726 B2 * | 10/2011 | Zhang et al. | 136/205 |
| 2004/0031514 A1 * | 2/2004 | Bell | 136/203 |
| 2004/0076214 A1 * | 4/2004 | Bell | 374/13 |
| 2005/0072165 A1 * | 4/2005 | Bell | 62/3.7 |
| 2005/0126184 A1 * | 6/2005 | Cauchy | 62/3.3 |
| 2005/0210883 A1 * | 9/2005 | Bell | 62/3.2 |
| 2005/0263177 A1 * | 12/2005 | Bell | 136/224 |
| 2007/0114011 A1 * | 5/2007 | Mamber | 165/133 |
| 2007/0193278 A1 * | 8/2007 | Polacek et al. | 62/3.2 |
| 2007/0199686 A1 * | 8/2007 | Okinotani et al. | 165/152 |
| 2008/0028769 A1 * | 2/2008 | Goenka | 62/3.7 |
| 2008/0047598 A1 * | 2/2008 | Lofy | 136/203 |
| 2008/0173342 A1 * | 7/2008 | Bell et al. | 136/201 |
| 2008/0230618 A1 * | 9/2008 | Gawthrop | 237/12.3 B |
| 2008/0245398 A1 * | 10/2008 | Bell et al. | 136/224 |
| 2008/0250794 A1 * | 10/2008 | Bell | 62/3.3 |

* cited by examiner

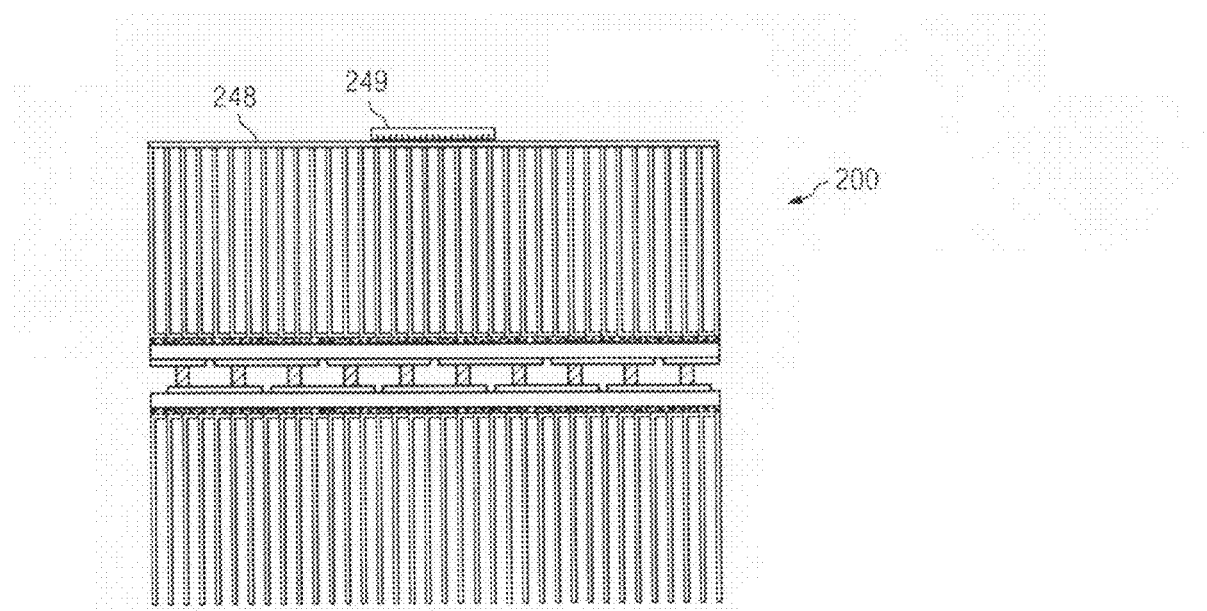
FIG. 6
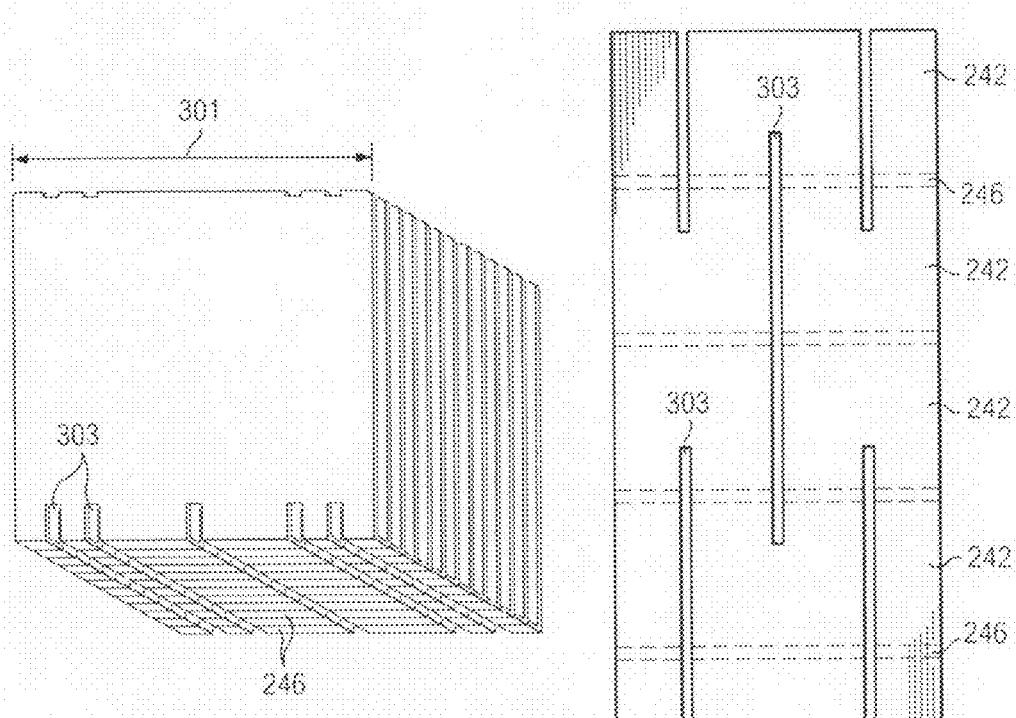
FIG. 7
FIG. 8

TEMPERATURE CONTROL DEVICE

CROSS REFERENCE TO RELATED APPLICATIONS

This application claims the benefit under 35 U.S.C. §119 (e) of U.S. Provisional Application No. 61/151,743, entitled "Temperature Control Device," filed Feb. 11, 2009.

TECHNICAL FIELD

The present disclosure relates to temperature regulation and more particularly to a temperature control device.

BACKGROUND

The basic theory and operation of thermoelectric devices has been developed for many years. Presently available thermoelectric devices used for heating and cooling applications typically include an array of thermoelectric elements which operate in accordance with the Peltier effect.

Thermoelectric devices may be described as essentially small heat pumps which follow the laws of thermodynamics in the same manner as mechanical heat pumps, refrigerators, or any other apparatus used to transfer heat energy. A principal difference is that thermoelectric devices function with solid state electrical components (thermoelectric elements or thermocouples) as compared to more traditional mechanical/ fluid heating and cooling components. The efficiency of a thermoelectric device is generally limited to its associated Carnot cycle efficiency reduced by a factor which is dependent upon the thermoelectric figure of merit (ZT) of the materials used in fabrication of the associated thermoelectric elements. Materials used to fabricate other components such as electrical connections, hot plates, and cold plates may also affect the overall efficiency of the resulting thermoelectric device.

Thermoelectric devices may be used in a variety applications. For example, due to the success of car seat cooling units, which rely on thermoelectric devices for temperature regulation, the market for personal cooling technologies has seen a great expansion in recent times.

SUMMARY

In accordance with a particular embodiment of the present disclosure, a temperature control device comprises a thermoelectric device and a first sink. The thermoelectric device includes a plurality of thermoelectric elements electrically interconnected with one another by a plurality of electrical interconnects. The thermoelectric elements are coupled between an interior surface of a first plate and an interior surface of a second plate. The first sink has a flat bottom and a plurality of generally parallel fins extending out of the flat bottom. Also, the flat bottom is coupled to an exterior surface of the first plate by a coupling media that includes a resilient and thermally-conductive pad.

Depending upon design, the flat bottom of the first sink may be soldered to a first side of the resilient and thermally-conductive pad, and the exterior surface of the plate may be soldered to a second side of the resilient and thermally-conductive pad, wherein the first side of the resilient and thermally-conductive pad is disposed opposite the second side of the resilient and thermally-conductive pad.

In some designs, the flat bottom may include a plurality of notches traversing the flat bottom perpendicular to the plurality of fins. Also, in some designs, the sink may consist of a contiguous sheet of metal having a plurality of consecutive folds.

Depending upon design, certain embodiments of the device may include a hydrophobic coating applied to the plurality of fins to inhibit moisture from accumulating on the plurality of fins.

In particular embodiments, one or more of the plurality of fins in the device may include a perforation surrounded by a generally frusto-conically shaped rim. That generally frusto-conically shaped rim may be nested inside another generally frusto-conically shaped rim surrounding a perforation in an adjacent fin of the device.

Depending upon design, one end of the plurality of fins may comprise a plurality of lateral folds and the flat bottom comprises an aggregation of the lateral folds.

In certain constructions, the device may further include a switch operable to electrically short the thermoelectric device during a passive mode of operation.

The device may also be designed such that the plurality of electrical interconnects cover substantially all of the surface area of the interior surfaces of the first and second plates, and the plurality of thermoelectric elements cover a minority of the surface area of the plurality of electrical interconnects.

Depending upon design, a thickness of the flat bottom may be equal to a thickness of a fin of the plurality of fins.

Technical advantages of particular embodiments of the present disclosure include providing a temperature control device that is well suited for the personal cooling market due to its low mass, compact size, high surface area, high coefficient of performance ("COP"), high volume manufacturing processes (low cost) and low volume. Particular embodiments of the present disclosure may include the advantage of having a hydrophobic coating applied to the temperature control device to prevent moisture from accumulating on the device during operation. Additionally, particular embodiments of the present disclosure may include oversized electrical interconnects on the plates of the thermoelectric device included in the temperature control device to more evenly distribute heat across the thermoelectric device, yet another technical advantage. Furthermore, in particular embodiments, the thermoelectric device may be electrically shorted during passive operation to lower the thermal resistance of the temperature control device by taking advantage of the Seebeck effect, yet another technical advantage. As another technical advantage, the sinks included in the temperature control device may include a plurality of stress relief notches operable to relieve stress imposed on the joint between the bottom of the fin structure and the ceramic plate of the thermoelectric device, due for example to CTE mismatch between these two components. Depending upon design, each sink may be coupled to the ceramic plate of the thermoelectric device by a resilient thermally-conductive pad (e.g., a piece of copper fabric, or a copper mesh pad) disposed between the sink and the ceramic plate. The resilient thermally-conductive pad may act as a buffer to absorb stress caused by differing rates expansion of the sink and the ceramic plate of the thermoelectric device when the temperature control device is operating, yet another technical advantage.

Other technical advantages of the present disclosure will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present disclosure and its advantages, reference is now made to the following descriptions, taken in conjunction with the accompanying drawings, in which:

FIG. 6 illustrates an example embodiment of the temperature control device of FIG. 2 as it may be used in microchip cooling applications;

FIG. 7 illustrates a particular embodiment of a sink that has been modified to include a series of notches perpendicular to its flow length; and FIG. 8 illustrates a flat sheet of thermally conductive material that may be folded to create a sink similar to that illustrated in FIG. 3B.

DETAILED DESCRIPTION OF EXAMPLE EMBODIMENTS

Figure 1A:
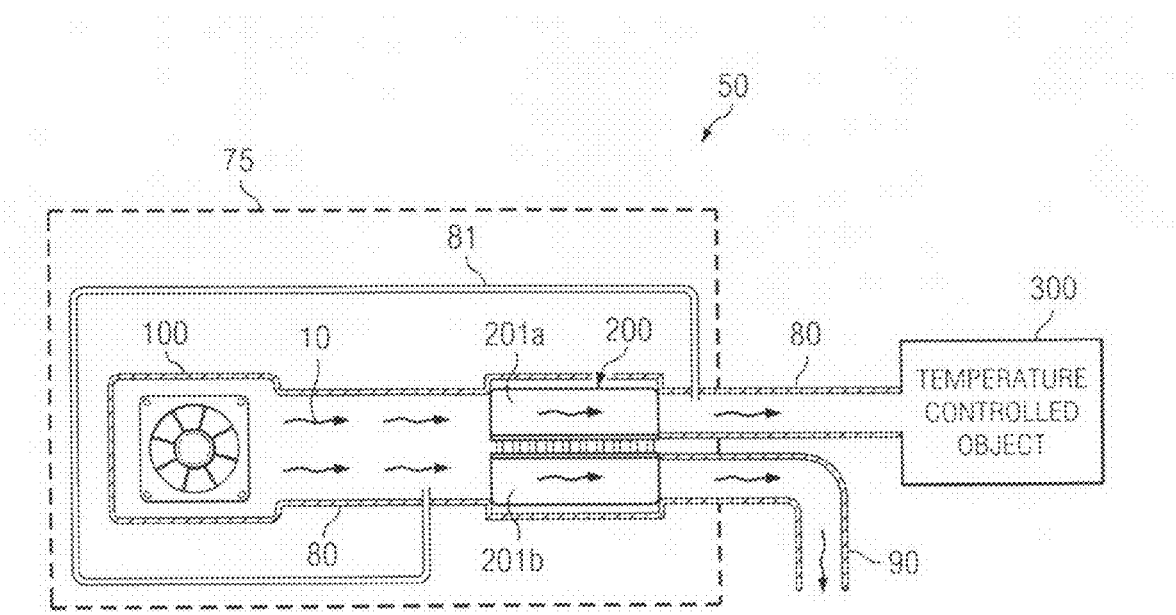
FIGS. 1A and 1B illustrate example embodiments of a temperature control system that includes a cooling unit coupled to a temperature-controlled item via a network of hoses according to the present disclosure.

FIG. 1A illustrates an example temperature control system 50 that includes a cooling unit 75 coupled to a temperature-controlled object 300. Cooling unit 75 generally includes a temperature control device 200 operable to generate or absorb heat and a circulation device 100 operable to circulate a flowable medium 10 across temperature control device 200.

Depending upon the design and application of temperature control system 50, flowable medium 10 could be, for example, a gas such as air, or a liquid such as water. In particular embodiments, temperature control system 50 could be a self-contained unit wherein a defined amount of flowable medium 10 is completely contained within a confined reservoir and is re-circulated through temperature control system 50. In other embodiments, temperature control system 50 could be an open unit wherein flowable medium 10 is freely exchanged with the surrounding environment. In still other embodiments temperature control system 50 may be a hybrid unit where a portion of flowable medium 10 (e.g., the portion intended for temperature controlled object 300) is re-circulated through temperature control system 50, while another other portion of flowable medium 10 (e.g., the portion that conducts waste energy away from temperature control device 200) is exchanged with the surrounding environment.

As will be explained in further detail below, temperature control device 200 may alter the temperature of flowable medium 10 as it passes through temperature control device 200. For example, in certain applications, temperature control device 200 may cool the portion of flowable medium 10 directed to temperature-controlled object 300. After being cooled by temperature control device 200, flowable medium 10 may be circulated through temperature-controlled object 300 to cool temperature-controlled object 300. In particular embodiments where flowable medium 10 is a gas, cooling unit 75 may further include a conduit or wick 81 for redirecting moisture from the output of temperature control device 200 into the hot side air intake of temperature control device 200 to pre-cool the air entering on the hot side of temperature control device 200.

Circulation device 100 may be any component of hardware or combination of such components capable of circulating flowable medium 10 throughout temperature control system 50. As an example and not by way of limitation, circulation device 100 could be a fan in embodiments where flowable medium 10 is a gas, or a pump in embodiments where flowable medium 10 is a liquid.

Circulation device 100 may circulate flowable medium 10 throughout temperature control system 50 via a network of hoses 80. A hose 80 may be any type of conduit capable conveying flowable medium 10 from one component of temperature control system 50 to another. As an example and not by way of limitation, a hose 80 may be a piece of flexible tubing spanning between two components of temperature control system 50. One of ordinary skill in the art will appreciate that the configuration of hoses 80 may be determined by the application for which temperature control system 50 is being used. For example, if temperature control system 50 is a self contained unit, hoses 80 will be configured to provide a re-circulating path for some or all of flowable medium 10. However, if temperature control system 50 is an open unit, hoses 80 may include one or more ports 90 for exchanging flowable medium 10 with the surrounding environment.

Depending upon design, a first side 201a of temperature control device 200 may be configured to condition the temperature of the portion of flowable medium 10 being circulated into temperature-controlled object 300, while a second side 201b of temperature control device 200 may be configured to dissipate unwanted thermal energy from temperature control device 200. For example if temperature control system 50 is an open unit, the portion of flowable medium 10 circulated through second side 201b may be expelled into the surrounding environment through an exhaust port 90.

Depending upon the mode of operation of temperature control device 200, flowable medium 10 may either raise or lower the temperature of temperature-controlled object 300. Temperature-controlled object 300 may be any type of item such as, for example, a bed, theater chair, office chair, vest, suit of body armor, or ice chest. In one particular embodiment, temperature control system 50 could represent a temperature-controlled suit of body armor capable of keeping a soldier from overheating in the field of combat.

Figure 1B:
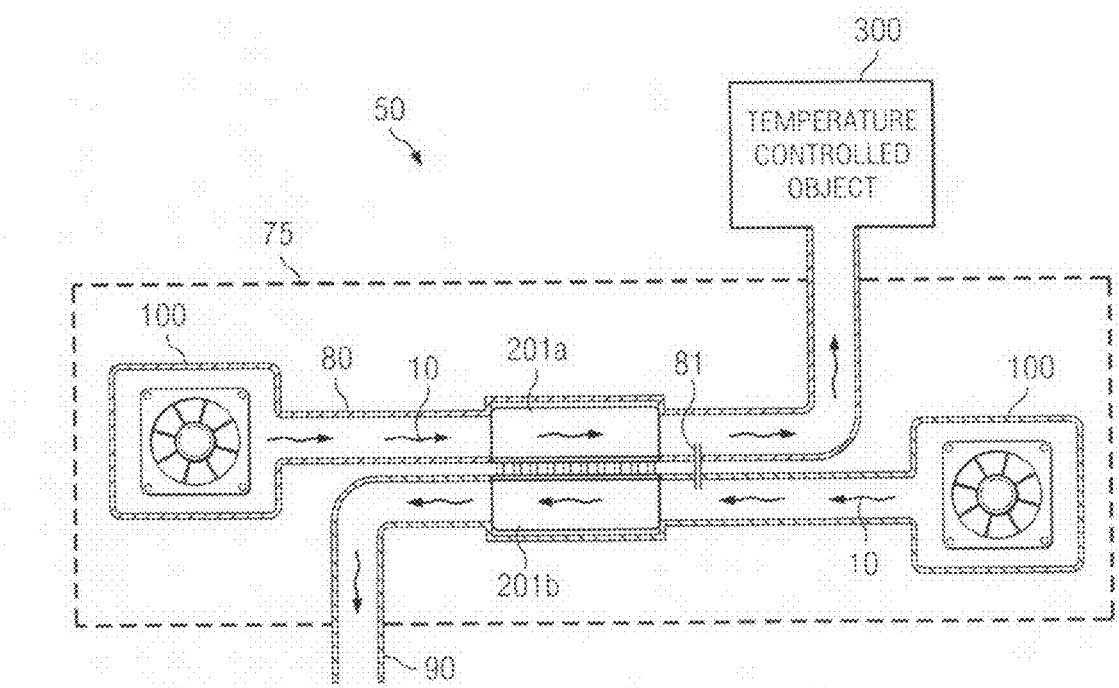

FIG. 1B shows another embodiment of temperature control system 50, in a counter-flow configuration. This embodiment operates according to the same general principles as the embodiment depicted in FIG. 1A, except that the direction of circulation across first side 201a runs counter to the direction of circulation across second side 201b. Also, as will be appreciated by one of ordinary skill in the art, in both embodiments, the portion of flowable medium 10 circulating across first side 201a may be held separate from the portion of flowable medium 10 circulating across second side 201b by hoses 80 or other suitable baffle or barrier.

Figure 2:
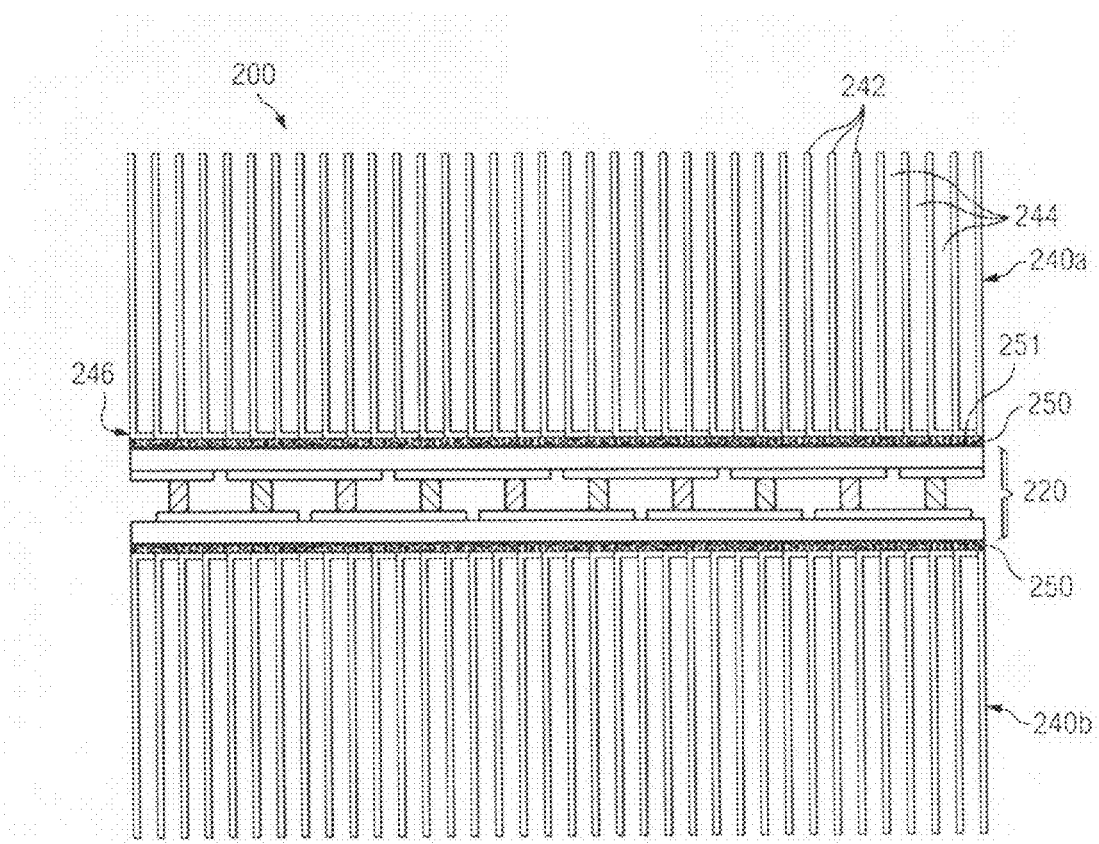
FIG. 2 illustrates an example embodiment of a temperature control device that may be used in the temperature control systems of FIGS. 1A and 1B.

FIG. 2 illustrates an example embodiment of temperature control device 200. Temperature control device 200 generally includes a thermoelectric device 220 sandwiched between a first sink 240a and a second sink 240b (collectively, sinks 240) which are coupled to thermoelectric device 220 by a coupling media 250. As explained in more detail below, when thermoelectric device 220 is attached to an appropriate source of power (e.g., a DC battery), one side of thermoelectric device 220 will generate heat and the other side of thermoelectric device 220 will absorb heat. The polarity of the current from the power source determines which side of thermoelectric device 200 absorbs heat and which side generates heat. When circulation device 100 circulates flowable medium 10 across temperature control device 200 (e.g., through spaces 244), sinks 240 may aid in transferring thermal energy into or out of thermoelectric device 220 by increasing the amount of surface area over which thermoelectric device 220 may dissipate thermal energy into or absorb thermal energy from flowable medium 10.

Figure 3A:
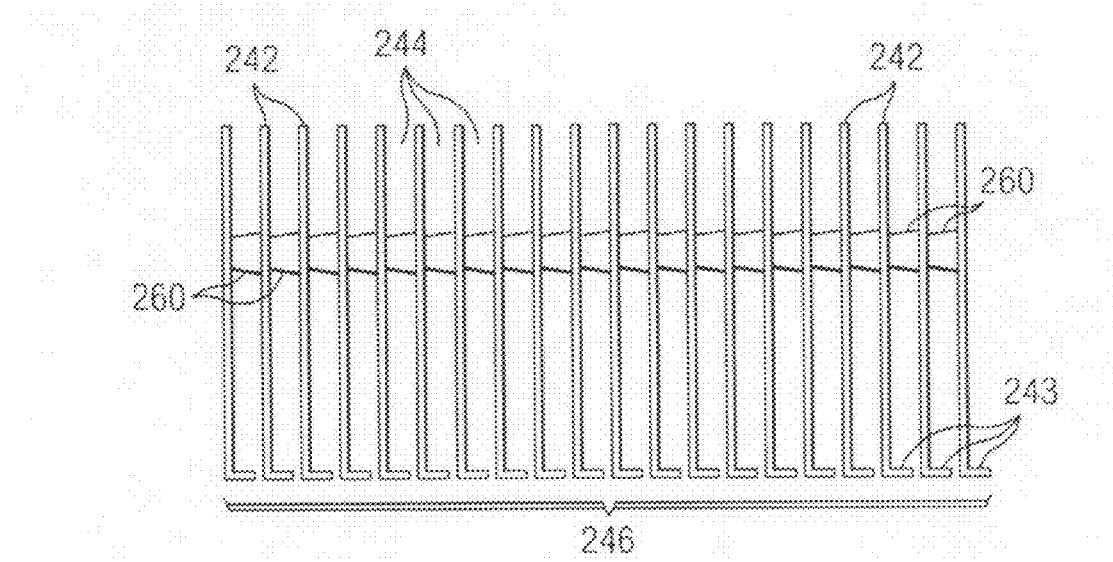
FIGS. 3A and 3B illustrate example sinks that may be used in the temperature control device of FIG. 2.

Each sink 240 may be any fixture capable of increasing the surface area over which thermoelectric device 220 may exchange thermal energy with the flowable medium 10. For example, as shown in FIG. 3A, a sink 240 may be a zipped or stacked fin heat exchanger comprising a plurality of closely-spaced fins 242, separated from one another by a series of spaces 244. Each fin 242 may include one or more flanges 260 or other features operable to interlock the plurality of fins 242 together into a single, unitary array. For example, in FIG. 3A, flanges 260 are illustrated as series of frusto-conically-shaped perforations in fins 242 that are nested inside one another to link fins 242 together.

Figure 3B:
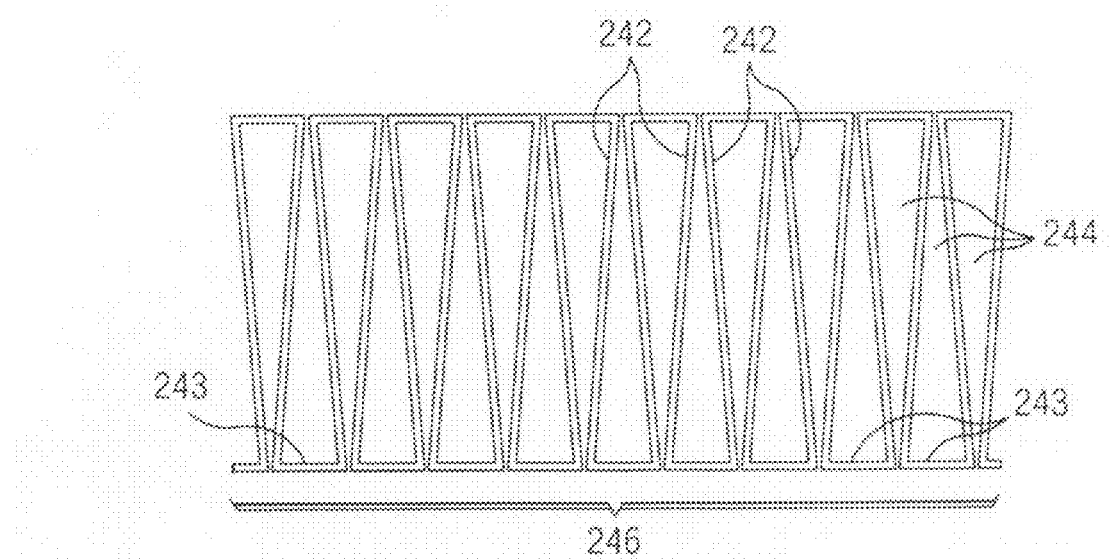

In other embodiments, sink 240 may be a folded fin structure, as shown in FIG. 3B, comprising a single sheet of material (e.g., copper) that has been consecutively folded over onto itself to create a single array of closely spaced fins 242. In either case, each one of fins 242 includes a lateral (e.g., generally L-shaped) fold 243 at one end that, when aggregated together, form a flat bottom 246 to sink 240. Sink 240 may be constructed out of a thermally conductive material such as copper, aluminum or other metal. However, any suitable thermally conductive material may be used.

In cases where flowable medium 10 is a gas such as air, due to the tight fin pitch (e.g., close fin spacing) associated with zipped or folded fin structures, strong capillary forces may fill spaces 244 with moisture at sub-ambient temperatures. The accumulation of moisture in spaces 244 may impede the flow of flowable medium 10 through temperature control device 200, thereby reducing its efficiency. In order to counteract the tendency of spaces 244 to fill with moisture, a hydrophobic coating may be applied to or incorporated into fins 242. The hydrophobic coating may be any compound or formula capable of preventing or retarding the accumulation of moisture on fins 244 during operation of temperature control device 200. As an example and not by way of limitation, the hydrophobic coating may be SILANE manufactured by Dow Corning, Inc.

Returning to FIG. 2, sinks 240 may be coupled to thermoelectric device 220 using any suitable method or mechanism. In particular embodiments, sinks 240 may be coupled to thermoelectric device 220 by a coupling media 250 applied between sinks 240 and thermoelectric device 220. Coupling media 250 may be any compound or fixture, or combination of compounds and fixtures operable to provide a thermally conductive bond between thermoelectric device 220 and sinks 240. As an example and not by way of limitation, coupling media 250 may be solder or thermally conductive epoxy. Thus, sinks 240 may be soldered or epoxied directly to thermoelectric device 220.

In particular embodiments, coupling media 250 may include a resilient thermally-conductive pad 251 (e.g., a woven mesh pad or a cloth) inserted between sink 240 and thermoelectric device 220. Each side of resilient thermally-conductive pad 251 may be soldered or epoxied directly to the adjacent surfaces of bottom 246 and thermoelectric device 220. When resilient thermally-conductive pad 251 is coupled between thermoelectric device 220 and sinks 240, the bonding agent (e.g., epoxy or solder) may only be applied to the outer surface of resilient thermally-conductive pad 251, leaving the interior of resilient thermally-conductive pad 251 free of epoxy or solder. In operation, resilient thermally-conductive pad 251 may provide a semi-flexible interface between thermoelectric device 220 and sinks 240 which absorbs stress caused by differing rates of thermal expansion between sinks 240 and the ceramic plates 224 of the thermoelectric device 220 when temperature control device 200 is operating. Depending on design, resilient thermally-conductive pad 251 may be constructed out of a thermally conductive material such as copper, aluminum, or other metal. However, the present disclosure contemplates using any suitable thermally conductive material in resilient thermally-conductive pad 251.

In particular embodiments, temperature control device 200 may be used in both passive and active modes. In active mode, thermoelectric device 220 may be turned "on" (e.g., supplied power from a power source) and may actively cool or heat flowable medium 10 as it passes through spaces 244. In passive mode, thermoelectric device 220 may be turned "off" and may passively heat or cool flowable medium 10 as it passes through spaces 244 by serving as a heat exchanger which passively conducts thermal energy into or out of the surrounding environment. Furthermore, in particular embodiments, thermoelectric device 220 may include a switch 221 (see FIG. 4) operable to electrically short thermoelectric device 220 during passive mode to lower its thermal resistance. Electrically shorting thermoelectric device 220 takes advantage of the Seebeck effect and enables thermal energy to flow through thermoelectric device 220 more easily. Depending upon design, switch 221 may have three positions: position 221a which places thermoelectric device 220 in active mode, position 221b which places thermoelectric device 220 in open circuit passive mode, and position 221c which places thermoelectric device 220 in short circuit passive mode. Thus, thermoelectric device 220 may be selectively configured to operate in either a short circuit or open circuit mode in order to maximize or minimize respectively the effective thermal conductance through thermoelectric device 220 when the device is passive. Additionally, a variable resistive load may be placed in series with thermoelectric device 220 to further tune its effective thermal conductance.

One of ordinary skill in the art will appreciate that the above-described embodiments of sinks 240 and coupling media 250 were presented for the sake of explanatory clarification and will further appreciate that the present disclosure contemplates using any suitable temperature exchange device as sink 140 and using any suitable coupling media 250 to create a thermally conductive bond between thermoelectric device 220 and sinks 240.

Figure 4:
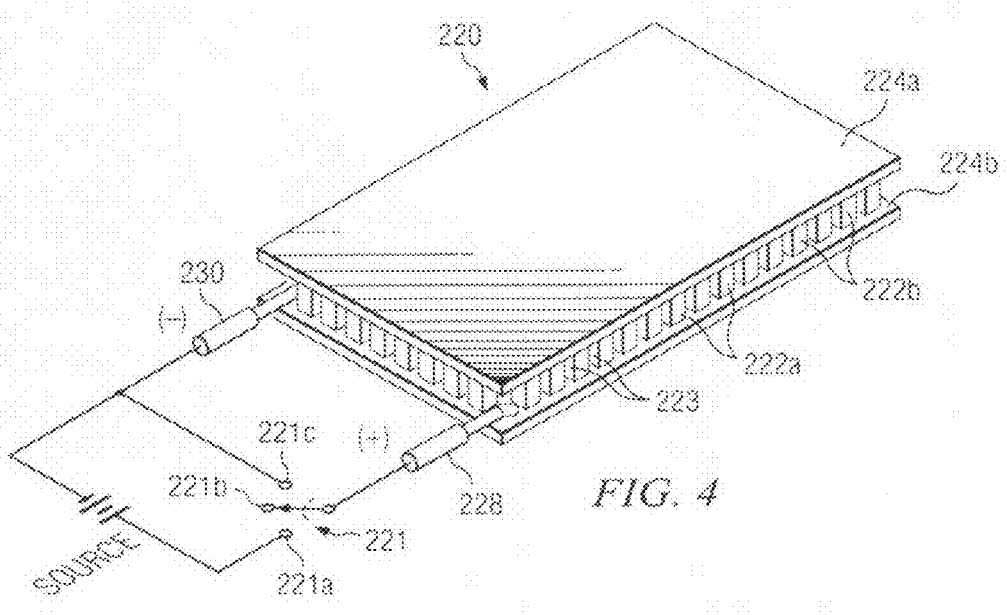
FIG. 4 illustrates an example embodiment of a thermoelectric device that may be used in the temperature control device of FIG. 2.

FIG. 4 illustrates a more detailed view of thermoelectric device 220. Thermoelectric device 220 generally includes a plurality of thermoelectric elements 222 disposed between a first plate 224a and a second plate 224b (collectively, plates 224). For reference, when positioned in temperature control device 200, first plate 224a would be included in first side 201a and second plate 224b would be included in second side 201b. Electrical connectors 228 and 230 are provided to allow thermoelectric device 220 to be electrically coupled with an appropriate source of electrical power (e.g., a battery that supplies DC current). As mentioned above, when thermoelectric device 220 is subjected to an electrical current (e.g., switched "on"), one side of thermoelectric device 220 will generate heat and the other side of thermoelectric device 220 will absorb heat.

Ceramic materials are frequently used to manufacture plates 224. However, in particular embodiments, either or both of plates 224 may be composed of a flexible material such as polyimide. Commercially available thermoelectric devices that function as temperature control devices generally include two ceramic plates with a plurality of P-type and N-type thermoelectric elements 222 formed from bismuth telluride ($Bi_2Te_3$) alloys, or other suitable thermoelectric materials, disposed between the ceramic plates 224 and electrically connected with each other.

The ends of thermoelectric elements 222 are electrically connected to one another by a series of electrical interconnects 234 (see FIGS. 5A and 5B) composed of an electrically and thermally conductive material such as copper. Depending upon design, electrical interconnects 234 may be a patterned metallization formed on the interior surfaces of plates 224 using any suitable deposition process. Also, depending upon the composition of elements 222 and electrical interconnects 234, a diffusion barrier metallization may be applied to the ends of elements 222 to provide a surface for soldering and to prevent chemical reactions from occurring between electrical interconnects 234 and elements 222. For example, the diffusion barrier may be needed if electrical interconnects 234 are composed of copper and thermoelectric elements 222 are composed of a bismuth telluride alloy. The diffusion barrier may comprise nickel or other suitable barrier material (e.g., molybdenum).

Figure 5A:
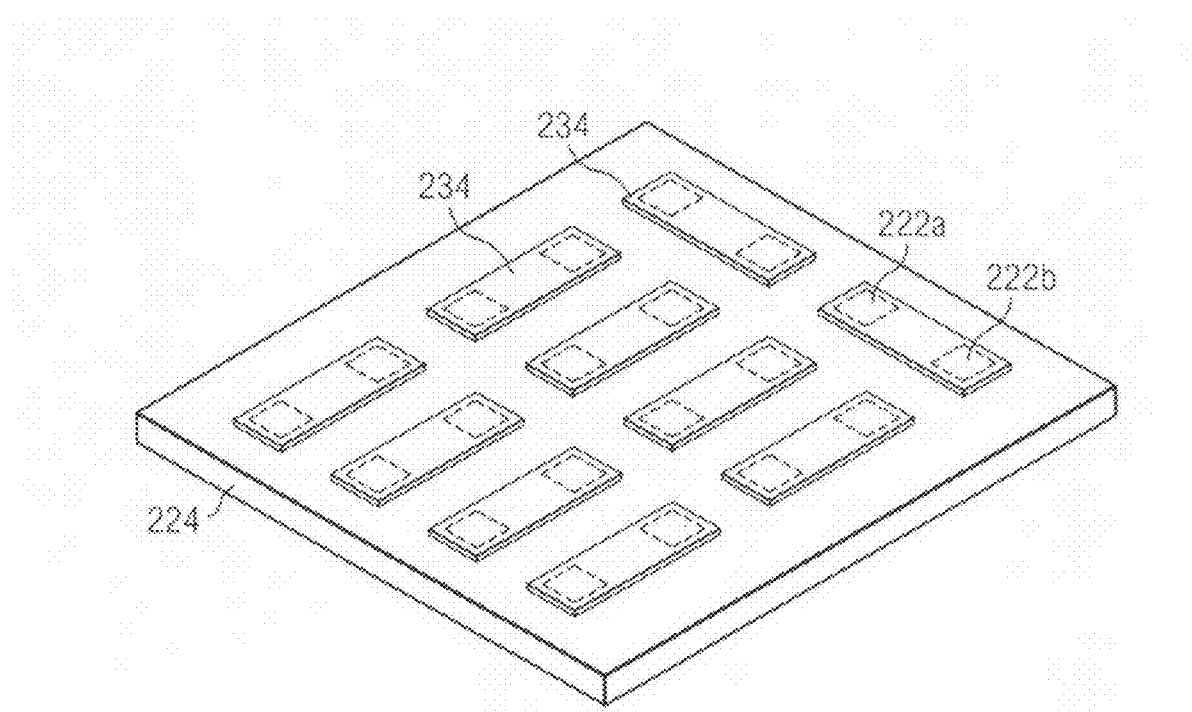
FIGS. 5A and 5B, respectively, illustrate two example patterns of electrical interconnects that may be implemented to electrically interconnect the elements in the thermoelectric device of FIG. 4.
Figure 5B:
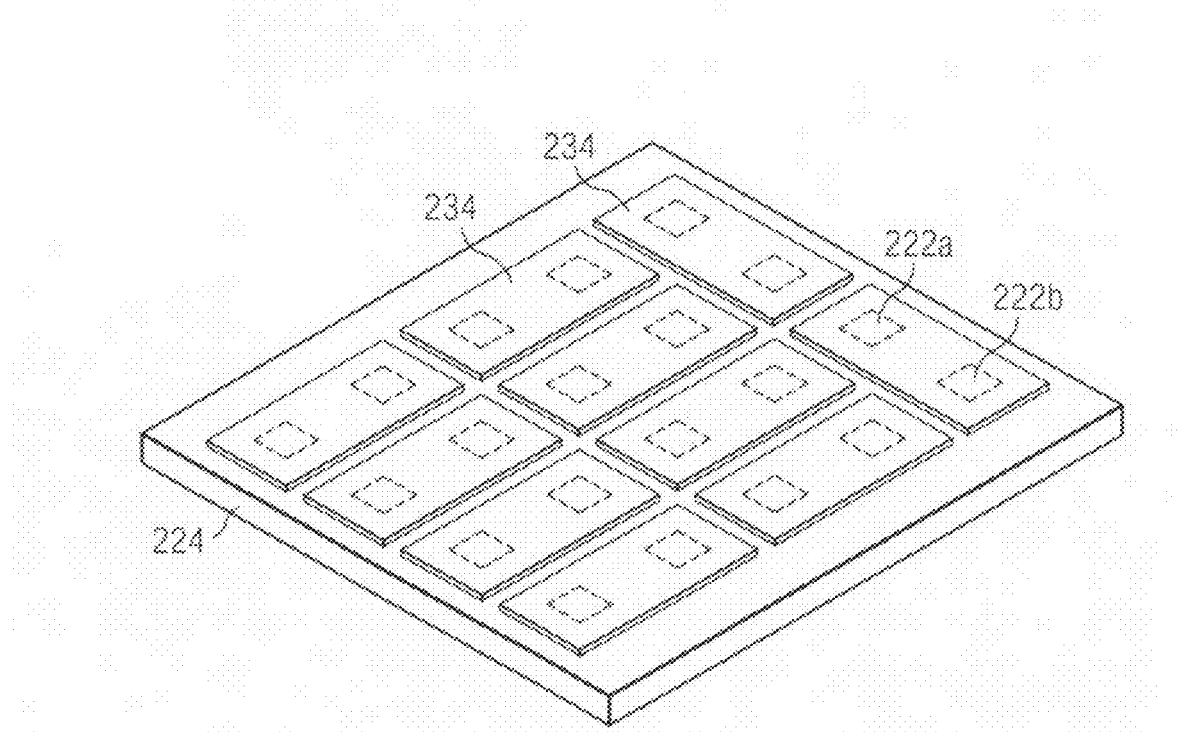

FIGS. 5A and 5B, respectively, illustrate two example patterns of electrical interconnects 234 that may be implemented to electrically interconnect elements 222 (represented as dashed boxes) in thermoelectric device 220. During active operation of thermoelectric device 220, electrical current is passed through elements 222 via electrical interconnects 234 to cause a temperature differential to develop across elements 222. In the mode of operation where temperature controlled object 300 is to be cooled, the electrical current causes thermal energy to be transferred from the hot sides of elements 222 into second plate 224b and thermal energy to be drawn from first plate 224a into the cold sides of elements 222. In particular embodiments, oversized electrical interconnects 234 may be incorporated into thermoelectric device 220 to spread thermal energy across plates 224 as explained in more detail below.

Typically, electrical interconnects 234 are thin metal strips (or traces) that are designed to transfer an adequate amount of electrical current between elements 222 to enable thermoelectric device 220 to operate as described above. For example, in a typical configuration of electrical interconnects 234 (as illustrated in FIG. 5A), approximately forty-six percent (46%), or more of the surface area of each electrical interconnect 234 may be occupied by elements 222. While this configuration may suffice to adequately power device 220, the relatively small foot print of each electrical interconnect 234 means that the heat spreading capability of that electrical interconnect 234 is relatively low, leaving most of the thermal energy from each element 222 to be transferred vertically into the portion of plates 224 residing directly above or below that element 222. This may lead to a less than optimal transfer of thermal energy between elements 222 and plates 224 due to hot spots and cold spots forming around the ends of elements 222.

To more evenly spread thermal energy across plate 226, particular embodiments of thermoelectric device 220 may include oversized electrical interconnects 234 (as illustrated in FIG. 5B), to spread thermal energy across the surface of plates 224. For example, each of the oversized interconnects 234 of FIG. 5B may be approximately 12 to 16 mils thick, 150 mils to 200 mils (e.g., 0.150 to 0.200 inches) wide, and may be separated from one another by approximately 12 mils (e.g., 0.012 inches) of space. Thus, depending upon design, electrical interconnects 234 may cover substantially all (e.g., between 60% and 100%) of the surface area of the interior surface of plate 224. By increasing the thermal mass of electrical interconnects 234 and by increasing the amount of surface area of plates 224 covered by electrical interconnects 234, particular embodiments of thermoelectric device 220 more evenly and efficiently transfer thermal energy from elements 222 to plate 226 and vice versa. For example, when electrical interconnects 234 are designed to spread thermal energy across plate 224b (as in FIG. 5B), approximately thirty-five percent (35%), or less of the surface area of each electrical interconnect 234 may be occupied by elements 222. Depending upon design, elements 222 may be widely spaced in thermoelectric device 220 to make room for oversized electrical interconnects 234. Using widely spaced elements 222 and oversized electrical interconnects 234 in thermoelectric device 220 may help match the thermal distribution of thermoelectric device 220 with the heat dissipation capability of sinks 240.

FIG. 6 illustrates an example embodiment of temperature control device 200 as it may be used in microchip cooling applications. As an example and not by way of limitation, a microchip 249 may be coupled to a heat spreader 248 such as for example a copper bar. Heat spreader 248 may be coupled to the free ends of fins 242 such that cool air may be circulated beneath heat spreader 248 to draw thermal energy away from microchip 249.

FIG. 7 illustrates a particular embodiment of a sink 240 that has been modified to include a series of notches 303 perpendicular to the flow length 301 of sink 240 to dissipate mechanical stress that may be imposed between flat bottom 246 and plate 224 due to a mismatch of the coefficients of thermal expansion (CTEs) between the materials that respectively make up those components. For example, in one construction of temperature control device 200, sinks 240 may be constructed from a material (e.g., copper or aluminum) having a CTE approximately three time greater than the material used to construct plates 224 (e.g., Aluminum Oxide $Al_2O_3$ ceramic). Consequently, when temperature control device 200 is heated or cooled, plates 224 and sinks 240 may expand and contract at different rates, imposing mechanical stress on the joint between the flat bottom 246 of sink 240 and plate 224.

Although, as described above, resilient thermally-conductive pad 251 may be inserted into the joint between flat bottom 246 and plate 224 to buffer the stress imposed by the CTE mismatch of those components, other measures may also be implemented instead of, or in addition to, resilient thermally-conductive pad 251 to help alleviate that stress. For example, in particular embodiments, a plurality of notches 303 may by formed in flat bottom 246, perpendicular to flow length 301 (e.g., transverse to fins 242) as a stress relief feature. Notches 303 may be any gap or opening or combination of gaps or openings in fins 242 and flat bottom 246 capable of relieving the mechanical stress imposed on flat bottom 246 in the direction of flow length 301 due to thermal expansion and contraction of sink 240. As an example and not by way of limitation, notches 303 may be a series of parallel channels, each approximately 3 mm to 5 mm tall and 0.5 mm to 1 mm wide, traversing flat bottom 246 perpendicular to fins 242. When temperature control device 200 is heated or cooled, notches 303 may provide room for fins 242 to expand or contract in the direction parallel to flow length 301, thereby providing stress relief on the interface between sink 240 and plate 224.

Notches 303 may be created using any suitable method. As an example and not by way of limitation, notches 303 may be created by freezing sink 240 in a block of ice and using a saw, to slice notches 303 into flat bottom 246. This method of creating notches 303 may use frozen water to support the structure of sink 240 during the process of creating notches 303. As another example and not by way of limitation, as shown in FIG. 8, if sink 240 is a folded fin structure, notches 303 may be created by punching a series of alternating slits into the sheet of material that will be folded into sink 240, prior to folding the sheet of material into sink 240. For example the slits may be organized on the sheet of material so that they align to form notches 303 in flat bottom 246 once the sheet is folded (e.g., along the dashed lines) into the shape of sink 240. For reference, the portions of the flat sheet of material that will become flat bottom 246 and fins 242 (after the folding process) are labeled as such.

Although the teachings of the present disclosure have been explained in several embodiments, a myriad of changes and modifications may be suggested to one skilled in the art, and it is intended that the present disclosure encompass all such changes and modifications.

The invention claimed is:

1. A temperature control device, comprising a thermoelectric device and a first sink, wherein:
   the thermoelectric device includes a plurality of thermoelectric elements electrically interconnected with one another by a plurality of electrical interconnects, the plurality of thermoelectric elements coupled between an interior surface of a first plate and an interior surface of a second plate;
   the first sink comprises a flat bottom and a plurality of generally parallel fins extending out of the flat bottom;
   the plurality of generally parallel fins comprises a plurality of flanges, each of the plurality of flanges disposed between the top and bottom of a respective fin of the plurality of generally parallel fins; and
   the plurality of flanges configured to sequentially connect adjacent fins of the plurality of generally parallel fins.

2. The temperature control device of claim 1, wherein:
   the flat bottom is coupled to an exterior surface of the first plate by a coupling media comprising a resilient and thermally-conductive pad; and
   the flat bottom comprises a plurality of notches traversing the flat bottom perpendicular to the plurality of fins.

3. The temperature control device of claim 2, wherein the flat bottom is soldered to a first side of the resilient and thermally-conductive pad and the exterior surface of the plate is soldered to a second side of the resilient and thermally-conductive pad, the first side disposed opposite the second side.

4. The temperature control device of claim 2, wherein the sink consists of a contiguous sheet of metal having a plurality of consecutive folds.

5. The temperature control device of claim 1, further comprising a hydrophobic coating applied to the plurality of fins, the hydrophobic coating adapted to inhibit moisture from accumulating on the plurality of fins.

6. The temperature control device of claim 1, wherein one or more of the plurality of fins comprises a perforation surrounded by a generally frusto-conically shaped rim nested inside another generally frusto-conically shaped rim surrounding a perforation in an adjacent fin of the plurality of fins.

7. The temperature control device of claim 1, wherein one end of the plurality of fins comprises a plurality of lateral folds and the flat bottom comprises an aggregation of the lateral folds.

8. The temperature control device of claim 1, further comprising a switch operable to electrically short the thermoelectric device during a passive mode of operation.

9. The temperature control device of claim 1, wherein:
   the plurality of electrical interconnects cover substantially all of the surface area of the interior surfaces of the first and second plates; and
   the plurality of thermoelectric elements cover a minority of the surface area of the plurality of electrical interconnects.

10. The temperature control device of claim 1, wherein a thickness of the flat bottom is equal to a thickness of a fin of the plurality of fins.

11. A temperature control device, comprising a thermoelectric device and a first sink, wherein:
    the thermoelectric device includes a plurality of thermoelectric elements electrically interconnected with one another by a plurality of electrical interconnects, the plurality of thermoelectric elements coupled between an interior surface of a first plate and an interior surface of a second plate;
    the first sink comprises a flat bottom and a plurality of generally parallel fins extending out of the flat bottom;
    the plurality of generally parallel fins comprises a plurality of flanges, each of the plurality of flanges disposed between the top and bottom of a respective fin of the plurality of generally parallel fins;
    the plurality of flanges configured to sequentially connect adjacent fins of the plurality of generally parallel fins;
    the flat bottom is coupled to an exterior surface of the first plate by a coupling media; and
    the first sink comprises a hydrophobic coating applied to the plurality of fins, the hydrophobic coating adapted to inhibit moisture from accumulating on the plurality of fins.

12. The temperature control device of claim 11, wherein the flat bottom includes a plurality of notches traversing the flat bottom perpendicular to the plurality of fins.

13. The temperature control device of claim 11, wherein the sink consists of a contiguous sheet of metal having a plurality of consecutive folds.

14. The temperature control device of claim 13, wherein the coupling media comprising a resilient and thermally-conductive pad.

15. The temperature control device of claim 14, wherein the flat bottom is soldered to a first side of the resilient and thermally-conductive pad and the exterior surface of the plate is soldered to a second side of the resilient and thermally-conductive pad, the first side disposed opposite the second side.

16. The temperature control device of claim 11, wherein one or more of the plurality of fins comprises a perforation surrounded by a generally frusto-conically shaped rim nested inside another generally frusto-conically shaped rim surrounding a perforation in an adjacent fin of the plurality of fins.

17. The temperature control device of claim 11, wherein one end of the plurality of fins comprises a plurality of lateral folds and the flat bottom comprises an aggregation of the lateral folds.

18. The temperature control device of claim 11, further comprising a switch operable to electrically short the thermoelectric device during a passive mode of operation.

19. The temperature control device of claim 11, wherein:
the plurality of electrical interconnects cover substantially all of the surface area of the interior surfaces of the first and second plates; and
the plurality of thermoelectric elements cover a minority of the surface area of the plurality of electrical interconnects.

20. A temperature control device, comprising a thermoelectric device and a first sink, wherein:
the thermoelectric device includes a plurality of thermoelectric elements electrically interconnected with one another by a plurality of electrical interconnects, the plurality of thermoelectric elements coupled between an interior surface of a first plate and an interior surface of a second plate;
the first sink comprises a flat bottom and a plurality of generally parallel fins extending out of the flat bottom;
the flat bottom is coupled to an exterior surface of the first plate by a coupling media; and
the thermoelectric device comprises a switch operable to electrically short the thermoelectric device during a passive mode of operation.

* * * * *